(12) United States Patent
Naito

(10) Patent No.: US 7,919,383 B2
(45) Date of Patent: Apr. 5, 2011

(54) CAPACITOR ELEMENT MANUFACTURING JIG AND CAPACITOR ELEMENT MANUFACTURING METHOD

(75) Inventor: Kazumi Naito, Chiba (JP)

(73) Assignee: Showa Denko K.K., Tokyo (JP)

( * ) Notice: Subject to any disclaimer, the term of this patent is extended or adjusted under 35 U.S.C. 154(b) by 226 days.

(21) Appl. No.: 12/094,694

(22) PCT Filed: Nov. 24, 2006

(86) PCT No.: PCT/JP2006/323402
§ 371 (c)(1),
(2), (4) Date: May 22, 2008

(87) PCT Pub. No.: WO2007/061034
PCT Pub. Date: May 31, 2007

(65) Prior Publication Data
US 2009/0269901 A1    Oct. 29, 2009

(30) Foreign Application Priority Data
Nov. 25, 2005   (JP) ................. 2005-340250

(51) Int. Cl.
*H01L 21/20* (2006.01)
*H01G 9/12* (2006.01)
(52) U.S. Cl. ...................... 438/381; 361/523
(58) Field of Classification Search .......... 438/381; 361/523
See application file for complete search history.

(56) References Cited

FOREIGN PATENT DOCUMENTS
| | | |
|---|---|---|
| JP | 2003-239698 A | 8/2003 |
| JP | 2005-244154 A | 9/2005 |
| WO | 2005/006360 A2 | 1/2005 |

*Primary Examiner* — W. David Coleman
(74) *Attorney, Agent, or Firm* — Sughrue Mion, PLLC

(57) ABSTRACT

The invention relates to a jig for producing capacitor elements, which is formed of resin material and is used for accommodate a plurality of capacitor element substrates therein to thereby batch-process the substrates. The jig is characterized in that portions of the jig at which the jig is supported during the process are protected with metal material. According to the invention, a group of capacitors each having a semiconductor layer serving as one electrode can be simultaneously produced with narrow variety in capacitance and with good precision, repeatedly, by using the jig having a high durability.

6 Claims, 2 Drawing Sheets

(A)  (B)

(A)  (B)

(A)  (B)

(A)   (B)

CAPACITOR ELEMENT MANUFACTURING JIG AND CAPACITOR ELEMENT MANUFACTURING METHOD

TECHNICAL FIELD

The present invention relates to a jig for producing capacitor elements which is durable and achieves stable appearance of capacitance, a method for producing capacitor elements using the jig and a capacitor obtained by the method.

BACKGROUND ART

A capacitor used around a CPU (central Processing Unit) in a personal computer or the like is required to have a high capacitance and a low ESR value so that voltage fluctuation can be suppressed and heat generation can be reduced when a high ripple current is passed.

Generally, two or more of aluminum solid electrolytic capacitor and tantalum solid electrolytic capacitor are used.

Such a solid electrolytic capacitor is constituted by one electrode (conductor) consisting of aluminum foil having micropores in its surface layer or a sintered body of tantalum powder having fine pores inside, a dielectric layer formed on the electrode surface and the other electrode provided on the dielectric layer (generally, a semiconductor layer).

Examples of method for forming a semiconductor layer which is to serve as the other electrode in a capacitor include methods of forming the layer by applying a current as described in Japanese Patent No. 1868722 (Patent Document 1), Japanese Patent No. 1985056 (Patent Document 2) and Japanese Patent No. 2054506 (Patent Document 3). In each of the methods, a conductor having a dielectric layer formed thereon is immersed in a solution for forming a semiconductor layer and then a voltage is applied (a current is applied) between the conductor serving as an anode and an external electrode (cathode) provided in the solution for forming a semiconductor layer, to thereby form a semiconductor layer.

[Patent Document1]Japanese Patent No. 1868722
[Patent Document2]Japanese Patent No. 1985056
[Patent Document3]Japanese Patent No. 2054506

DISCLOSURE OF THE INVENTION

Problems to be Solved by the Invention

In a case where a semiconductor layer is formed on the above-mentioned conductor having a dielectric layer formed thereon by applying a current, there is no problem in forming a semiconductor layer on one conductor. When the semiconductor layer is to be formed on multiple conductors, however, since the conductors do not always have the same properties with each other and the speed for forming the semiconductor layer on the conductors may be different from each other, the resultant semiconductor layers sometimes become non-uniform in qualities and production of capacitors with stable capacitance is difficult. For example, in an extreme case, when one conductor became defective (which resulted in almost short circuit failure) and the electric current concentrated on this conductor, little current was passed to the other conductors.

The present inventors previously proposed a jig for producing capacitor elements comprising the output of each of multiple discharge-type constant current sources electrically connected to the connecting terminal of each of multiple conductors, as a jig for simultaneously forming a semiconductor layer on multiple conductors by applying a current. In order to incorporate such a circuit, the inventors used an insulative substrate for the jig, typically a glass-blended epoxy (glass-epoxy) substrate to thereby achieve uniformity of the applied current (Japanese Patent Application Laid-Open No. 2005-244154 (International Publication No. WO2005/06360 pamphlet)). When such a resin substrate is repeatedly used multiple times, however, deformation of the substrate occurs. As a result, it leads to a greater variation in properties of capacitors thus produced.

Means for Solving the Problems

Therefore, the object of the present invention is to overcome the problem of widened variation in properties of capacitors produced by using a jig for producing capacitor elements which simultaneously processes a plurality of capacitor element substrates even when the jig has been used continuously for a long time.

As a result of intensive studies with a view to solving the problem, the present inventors have solved the problem by using a jig for producing capacitor elements characterized in that parts supporting the jig when the production process proceeds are protected with a metal material.

That is, the present invention provides a jig for producing capacitor elements and a method for producing capacitor elements, as follows.

1. A jig for producing capacitor elements, made of a resin material, which jig simultaneously accommodates a plurality of capacitor elements and processes the substrates, wherein parts supporting the jig during the process are protected with a metal material.
2. The jig for producing capacitor elements according to 1, wherein the jig has a long-plate form and has parts for supporting the jig on both ends in the longitudinal direction or in the vicinity of the ends.
3. The jig for producing capacitor elements according to 1 or 2, wherein the resin material is glass-epoxy resin.
4. The jig for producing capacitor elements according to 2, wherein the metal material for protecting the parts is in form of cylinder which covers a part of the jig including the supporting part, which cylinder may have a cleavage groove in part.
5. The jig for producing capacitor elements according to 4, wherein the protecting metal material is fixed to the resin material by making use of its resilience.
6. The jig for producing capacitor elements according to any one of 1 to 5, which has at least part of an electric circuit for applying electric current to each capacitor element substrate.
7. A method for producing capacitor element, using the jig for producing capacitor elements described in any one of 1 to 7.
8. The method for producing capacitor element according to 7, wherein in a solution for forming a semiconductor layer, a semiconductor layer is formed on substrates for capacitor elements each having a dielectric layer thereon connected with the jig for producing capacitor elements by applying electric current with the capacitor element substrates being used as anode and an electrode provided in the solution for forming a semiconductor layer being used as cathode.

Effect of the Invention

The present invention provides a jig for producing capacitor elements which can accommodate a plurality of capacitor element substrates to process the substrates simultaneously and is durable and also provides a method for producing capacitor elements using the jig. According to the present invention, a group of capacitors can be stably obtained with a narrow variation in capacitance.

BEST MODE FOR CARRYING OUT THE INVENTION

The jig for producing capacitor elements and the production method of capacitor element according to the present invention are described in detail, hereinbelow.

The jig for producing capacitor elements of the present invention consists of resin material for accommodating a plurality of capacitor element substrates to be processed simultaneously. The jig is characterized in that the parts for supporting the jig during the production process are protected with metal material.

The jig for producing capacitor elements of the present invention can be used without limitation as long as the purpose is simultaneous processing of capacitor element substrates. Especially, the jig is suitably employed in a case where the capacitor element substrates are conductors. That is, in a preferred embodiment of the present invention, a plurality of the jigs for producing capacitor elements to each of which jigs a plurality of capacitor element substrates (conductors) are connected are aligned in the same direction in a frame, and a dielectric layer, a semiconductor layer or an electrode layer is formed on the plurality of the conductors simultaneously. Each of the layers is formed by immersing the conductors in a bath containing a solution for forming the layer and applying electric current thereto. Hereinafter, the present invention is explained by using this embodiment as a representative example.

When the conductors are immersed in the bath containing the solution, positioning is conducted by contacting the lower end of the jig for producing capacitor elements with a fiducial bar (10), so that the conductors fixed in the jig for producing capacitor elements can be immersed in the solution in a precise manner. As the fiducial bar, generally, those made of metal are employed. Preferred are those made of non-degraded or non-oxidized metal material, in particular, iron alloy (e.g. stainless steel) is used. Two fiducial bars are placed with a distance between them which is determined according to the longitudinal length of the jig for producing capacitor elements and the widths of the chemical-formation tank and the tank for the solution for forming a semiconductor to be contained. In consideration for immersing operation, it is preferable that the bars be placed each at a position such that each of the bars can contact with the jig at a portion of 1 to 20 mm inward from each end of the jig for producing capacitor elements.

A fiducial bar has a length of 50 to 1000 mm and a height of 10 to 100 mm. The portion contacting with the lower end of the jig for producing capacitor elements has a width of 0.1 to 10 mm (see FIG. 1.).

In a case where a plurality of the jigs for producing capacitor elements to each of which jigs conductors are connected are aligned in the same direction in a frame and a dielectric layer, a semiconductor layer or an electrode layer is formed on each of the conductors simultaneously, it is necessary to keep the jigs for producing capacitor elements horizontal in order to immerse the conductors in each bath containing the solution for forming the layer in a precise manner.

Generally, positioning is conducted such that the lower surface of the jig for producing capacitor elements (11) can contact with fiducial bars (10) (generally made of metal) placed in a container serving as a solution bath (9) or in the vicinity of the container (see FIG. 1). As described later, in the present invention, a resin substrate is mainly used as a jig. Such a jig for producing capacitor elements, however, tends to generate a wider variation in capacitance values of capacitors produced by using the jig if the jig is repeatedly used several hundreds of times. The present inventors have assumed that the capacitance variation is caused by a mechanism as follows: abrasion at the time of contact between fiducial bars and the jig forms dents and thus, the more the jig is used, the less precise the positioning of the jig for producing capacitor elements becomes. Based on this assumption, the present inventors have succeeded in remarkably narrowing variation in capacitance by forming a structure where the parts of the lower end of the resin substrate which contact with the fiducial bars are protected.

In the present invention, as the material for protecting the portions of the jig for producing capacitor elements (supporting parts) which contact with the fiducial bars, a metal material is used.

The protective metal material may have any shape as long as the supporting parts of the jig for producing capacitor elements can be protected by the metal material. It is preferable that the metal material have a shape which can enclose each of the longitudinal ends of the jig for producing capacitor elements or the portions in the vicinity of the ends. Specific examples are shown in FIGS. 2 to 5. Here, the vicinity of the ends means the portion between the end and the portion at which capacitor element substrates are fixed.

FIG. 2(A: side view, B: front view) and FIG. 3 (A: side view, B: front view) each show a protective metal material having an opening part which engages with an end of the jig or the vicinity of the end by inserting the jig into the opening to fix it. When the jig is inserted into the opening portion, the protective material forms a cylindrical shape or a cylindrical shape having a cleavage groove in part which at least encloses the supporting portion of the jig to protect it. The width of the opening portion may be any width as long as the width is larger than the thickness of the jig for producing capacitor elements. Preferably, the width is approximately the same with the thickness of the jig. If so, the protective material does not move after the material is applied. If desired, the protective metal material is fixed by using an adhesive agent such as epoxy adhesive.

FIG. 4(A: side view, B: front view) and FIG. 5 (A: side view, B: front view) each show a structure of a metal material having an opening part which engages with an end of the jig or the vicinity of the end with one side or the bottom side forming a concave curve and given a spring function by taking advantage of the elasticity of the material. By this structure, after the metal material is fixed, the spring becomes flat to thereby prevent disengagement, and also in a case where an electrode has been provided on one end part of the jig, the metal material can be conductive to the electrode surface. The width of the opening part is almost the same as the thickness of the jig for producing capacitor elements. If so, the protective metal material does not move after the material is applied. If desired, the protective metal material is fixed by using an adhesive agent such as epoxy adhesive.

As the protective metal material used in the jig for producing capacitor elements of the present invention, a metal material which is easy to be handled in bending process and also is hard to be oxidized is used. Especially, iron alloys SUS316 and SUS304 are preferred. By using the same material as the above fiducial bar, contact-potential difference between the two can be reduced to the minimum. The preferred thickness of the protective metal material for the jig for producing capacitor elements is from 0.1 to 0.3 mm in consideration of processability.

It is preferable that the jig for producing capacitor elements of the present invention have at least part of an electric circuit corresponding to each capacitor element substrate to pass electric current to the capacitor element substrate, and the jig is used in production of capacitors involving energization. Such a jig can be manufactured, for example, by connecting a constant current diode or a diode to an insulative substrate having an electric circuit formed thereon, or in some cases, bonding a connection terminal having a socket structure or a connection terminal of metal plate to the substrate through soldering. Preferred examples of material of insulative substrate include resin materials such as glass-epoxy resin and imide resin. It is preferable to use an insulative resin having a thickness of 1 to 10 mm, more preferably 1.2 to 4 mm, even more preferably 1.5 to 4 mm, in consideration for good dimension accuracy, avoiding deformation even after used many times, and good handleability.

With respect to the electric circuit, for example, examples of circuit for passing an electric current to conductors having a dielectric layer on its surface include a circuit where a discharge-type constant current source is provided for each connection terminal of the conductors and each of the connection terminals is electrically connected to the output of the current source. One example where the constant current source is constituted by using a constant current diode is a structure where each anode of two or more constant current diodes is electrically connected and each connection terminal for the conductors is electrically connected to the cathode of each of the constant current diode.

Hereinbelow, a method for forming a semiconductor layer by using the above-described jig for producing capacitor elements through applying electric current is explained.

Each conductor having a dielectric layer on its surface is connected to a connection terminal for the conductor (substrate for a capacitor element) in the jig for producing capacitor elements and only the conductors are immersed in a solution for forming a semiconductor layer. By applying electric current while using the conductor side as an anode and an electrode provided in the solution for forming a semiconductor layer as cathode, a semiconductor layer can be formed. Although an example mainly using a constant current diode as the constant current source is mentioned here, the current source is not limited thereto.

FIG. 6 shows a typical view of one example of such a plate-like jig for producing capacitor elements (the protective metal material is omitted in the Figure). A plurality of constant current diodes (1) are placed in parallel and connected to each other on an insulative plate (2). The anode (the upper end of (1) in the Figure) of each constant current diode (1) is electrically connected to the terminal (3) provided on the left in the Figure (hereinafter, the terminal is sometimes referred to "collector terminal"). The cathode (1a) is connected to a connection terminal (4) for the conductor and the other end of each connection terminal (4) is left unconnected electrically. When a jig having the structure of FIG. 6 is put into practical use, conductors each having a dielectric layer on the surface (not shown in the Figure) are each connected to each connection terminal (4).

Examples of conductor used in the present invention include metal, inorganic semiconductor, organic semiconductor, carbon, a mixture containing at least one of these materials, and a laminated body where a conductor is stacked on such a material.

Examples of inorganic semiconductor include metal oxides such as lead dioxide, molybdenum dioxide, tungsten dioxide, niobium monoxide, tin dioxide, and zirconium monoxide. Examples of organic semiconductor include polypyrrole, polythiophene, polyaniline and substituted compounds having a polymer skeleton of these polymers, electroconductive polymers such as copolymers, a complex of tetracyanoquinodimethane (TCNQ) and tetrathiotetracene, and low-molecular-weight complexes such as TCNQ salt. Examples of laminated body having a conductor stacked on its surface include laminated bodies having a conductor stacked on paper, an insulative polymer or glass.

In a case where metal is used for the conductor, part of the metal may be used after subjecting to at least one treatment selected from carbonization, phosphation, boronation, nitridation, sulfidation and oxidation.

There is no limitation on the shape of the conductor, and the conductor may have either shape of foil sheet, bar and the like. Also, the surface of the conductor may be subjected to etching treatment to thereby provide micropores there. Micropores may be provided by molding or sintering. In that case, part of a separately-prepared lead wire may be molded together with the conductor and the part outside the molded body may be used as an outgoing lead for one electrode of the capacitor. Alternatively, of course, a lead wire may be directly connected to the conductor.

Examples of dielectric layer formed on the conductor surface include dielectric layers mainly containing at least one of metal oxides such as $Ta_2O_5$, $Al_2O_3$, $Zr_2O_3$ and $Nb_2O_5$ and those conventionally known in the fields of ceramic capacitors and film capacitors. In case of the dielectric layer mainly containing at least one of the metal oxides, a capacitor whose dielectric layer can be obtained by chemically forming the conductor containing a metal element to constitute the metal oxide becomes a polarized electrolytic capacitor. Examples of conventionally known dielectric layer in the fields of ceramic capacitors and film capacitors include those described in Japanese Patent Application Laid-Open No.S63-29919 and Japanese Patent Application Laid-Open No.S63-34917 also by the present applicant. Also, two or more of dielectric layers mainly containing at least one of the metal oxides and those dielectric layers known in the fields of ceramic capacitors and film capacitors may be stacked and used. Also, two or more of dielectric layers mainly containing at least one of the metal oxides and those dielectric layers known in the fields of ceramic capacitors and film capacitors may be mixed.

By using the jig for producing capacitor elements according to the present invention, a dielectric layer can be formed on the conductor surface. That is, after positioning and connecting a conductor to each of the connection terminals in the jig for producing capacitor elements, each of the conductors is immersed in chemical formation solution. Then, for example, by using a terminal supplying current for chemical formation as an anode and using an external electrode placed in the chemical formation solution as a cathode, a dielectric layer can be formed. The chemical formation solution contains known electrolyte of organic acid or its salt (such as adipic acid, acetic acid, ammonium adipate and benzoic acid) and inorganic acid and its salt (such as phosphoric acid, silicic acid, ammonium phosphate, ammonium silicate, sulfuric acid and ammonium sulfate) dissolved or suspended therein. The conditions for chemical formation such as temperature, time, current value and voltage are determined by conducting preliminary experiments according to the type, size and mass of the conductor to be used and the standard of the target capacitor. After forming a dielectric layer on the conductor surface, power supply from the supply terminal is stopped and the conductors are washed and dried. Then, by passing electric current from the terminals present on the insulative substrate surface or the terminals of the constant current diode group in the same manner as in the case of forming the semiconductor layer as afore-mentioned, a semiconductor layer can be formed on the dielectric layer of the conductor.

On the other hand, semiconductor contained in the semiconductor is at least one compound selected from organic semiconductors and inorganic semiconductors. Here, it is important to form such a compound in the method involving passing of electric current as described method.

Examples of organic semiconductor include an organic semiconductor consisting of benzopyrroline tetramer and chloranile, an organic semiconductor mainly consisting of tetrathiotetracene, an organic semiconductor mainly consisting of tetracyanoquinodimethane and an organic semiconductor mainly consisting of an electroconductive polymer prepared by doping a dopant to a polymer having a repeating unit represented by formula (1) or (2).

[Chem. 1]

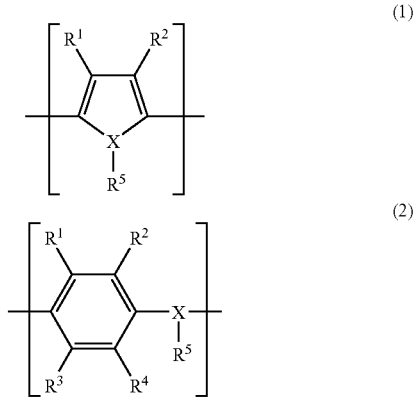

In the formula, $R^1$ to $R^4$ each independently represents a hydrogen atom, an alkyl group having 1 to 6 carbon atoms or an alkoxy group having 1 to 6 carbon atoms, X represents an oxygen atom, a sulfur atom or a nitrogen atom, $R^5$, which is present only when X is a nitrogen atom, represents a hydrogen atom or an alkyl group having 1 to 6 carbon atoms, and $R^1$ with $R^2$ or $R^3$ with $R^4$ may combine with each other to form a ring.

Further, in the present invention, the electroconductive polymer containing the repeating unit represented by formula (1) is preferably an electroconductive polymer containing as repeating unit a structural unit represented by formula (3).

[Chem. 2]

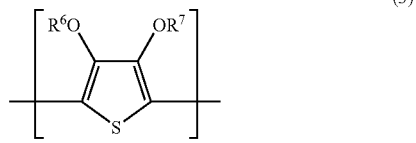

In the formula, $R^6$ and $R^7$ each independently represents a hydrogen atom, a linear or branched, saturated or unsaturated alkyl group having 1 to 6 carbon atoms, or a substituent forming at least one 5- to 7-membered saturated hydrocarbon ring structure containing two oxygen atoms, in which said alkyl groups are bonded at arbitrary positions with each other. Also, examples of the ring structure include those having a vinylene or phenylene bond which may be substituted.

The electroconductive polymer containing such a chemical structure is charged and doped with a dopant. There is no particular limitation on the dopant and known dopants may be used.

Examples of polymer containing a repeated unit represented by formula (1), (2) or (3) include polyaniline, polyoxyphenylene, polyphenylene sulfide, polythiophene, polyfuran, polypyrrole, polymethylpyrrole, substituted derivatives thereof and copolymers thereof. Preferred among them are polypyrrole, polythiophene and substituted derivatives thereof (such as poly(3,4-ethylenedioxythiophene)).

Inorganic semiconductor is at least one compound selected from molybdenum dioxide, tungsten dioxide, lead dioxide and manganese dioxide.

When the organic or inorganic semiconductor used has an electric conductivity of $10^{-2}$ to $10^3$ S/cm, the solid electrolytic capacitor produced can have a small ESR value and this is preferred.

By applying current in the semiconductor layer-forming solution containing raw materials for forming semiconductor and in some cases, at least one of the above-described dopants (such as known dopants, e.g., aryl sulfonic acid or salt thereof, alkyl sulfonic acid or salt thereof and known compounds having each of the above described substituents) therein, a semiconductor layer is formed on a dielectric layer. Since the current-passing time, the concentration, pH and temperature of the semiconductor layer-forming solution vary according to the type, size and mass of the conductor used there and the desired thickness of the semiconductor layer, the conditions are determined by conducting preliminary experiments. Electric current may be passed twice or more times with different conditions. Moreover, for the purpose of mending defects generated in the dielectric layer on the conductor surface, known chemical reformation method may be conducted at an arbitrary timing (once or more) between these semiconductor formation steps and/or after the completion of the semiconductor formation.

As an example, on the rear surface of an insulative resin plate (2) shown in FIG.6, an electric circuit electrically connected to connection terminals (4) provided on the front surface is formed as shown in FIG. 7. Each end of the electric circuit is connected via a diode (7)(preferably a rectifier diode) to the metal material (6) serving also as a terminal which is provided on the right side as viewed from the front (hereinafter, this is sometimes referred to as "supply terminal"). (The side of the supply terminal (6) for chemical formation serves as an anode. In the present invention, when the term "diode" is simply mentioned, it does not include constant current diode.) By this connection, formation of dielectric layer on the surface of the conductor connected to each of the connection terminals (4) and formation of semiconductor layer can be conducted by using the same jig, which is convenient. That is, in a case where a dielectric layer to be formed on the conductor surface is provided by chemical formation, electric current is passed from the supply terminal for chemical formation (6) on the insulative substrate (2) and then, in a case where a semiconductor layer is formed on the dielectric layer, electric current is passed from the supply terminal (6) on the insulative substrate (2) or the metal material (3) serving also as a collector terminal for the constant current diode group. In this way, operations, even when the current values are different between chemical formation and formation of semiconductor layer, can be conducted by using the same jig.

There is no limitation on placement of the collector terminal, the constant current diode, the diode and the supply terminal on the insulative substrate. It is preferable that those members be placed such that an electric circuit can be easily formed.

Examples of connection terminals in the present invention include connection terminal having a socket structure, metal plate, and connection terminal drawn by printing technique and consisting of foil-like metal material.

A connection terminal using both a socket structure and a metal plate falls within the scope of the present invention. Examples thereof include a connection terminal having a structure consisting of a receiving portion to be built in the substrate and a metal plate electrically connected to the receiving portion and a connection terminal having a structure consisting of a linear lead part and a metal plate electrically connected to the lead part. For example, in case of using the former, the receiving portion is built in the part of the output wiring of the insulative substrate having a discharge-type constant current source placed thereon and the conductor is connected to the metal plate, so that the connection terminal can exhibit its function. In case of using the latter, the linear lead part is inserted into the through-hole provided in the insulative substrate having a discharge-type constant current source placed thereon and the conductor is connected to the metal plate, so that the connection terminal can exhibit its function.

An electrode layer may be provided on the semiconductor layer formed by the above-described method, so that electric contact with an outgoing lead (e.g. a lead frame) of the capacitor may be improved.

The electrode layer can be formed, for example, by solidification of an electrically conducting paste, plating, metal deposition or formation of a heat-resistant electrically conductive resin film. In a case where an electroconductive paste is used, an electrode layer may be formed by using the jig for producing capacitor elements of the present invention and simultaneously immersing a plurality of conductors having a semiconductor layer thereon in a tank containing the paste. Preferred examples of the electrically conducting paste include silver paste, copper paste, aluminum paste, carbon paste and nickel paste. One of these may be used or two or more thereof may be used. In the case of using two or more pastes, these pastes may be mixed or stacked as separate layers. The electrically conducting paste applied is then left standing in air or heated to thereby be solidified.

An electroconductive paste mainly contains resin and electroconductive powder of metals or the like. In some cases, it further contains a solvent for dissolving the resin, a curing agent for the resin, or the like.

Examples of resin used in the electroconductive paste include various known resins such as alkyd resin, acrylic resin, epoxy resin, phenol resin, imideamide resin, amide resin, styrene resin and urethane resin. As an electroconductive powder, at least one selected from silver, aluminum, gold, carbon, nickel, alloy powders mainly containing these metals, powders coated with these metals and powders of mixture of these metals is used.

Generally, an electroconductive paste contains 40 to 97 mass % of electroconductive powder. If the content is less than 40 mass %, the conductivity of the prepared electroconductive paste is low. If the content exceeds 97 mass %, adhesiveness of the prepared electroconductive paste is low. An electroconductive paste in mixture with electroconductive polymer or metal oxide powder as previously described as usable in forming the semiconductor layer may be used.

By jacketing a capacitor having the above structure with resin molding, a resin case, a metallic jacket, resin dipping or a laminate film, the capacitor can become a capacitor product for various uses.

Among these, a chip-type capacitor jacketed with resin molding is preferred in that downsizing and cost-reduction can be achieved.

A thus-manufactured capacitor may be subjected to aging treatment for the purpose of mending portions thermally or physically deteriorated at the time of forming an electrode layer or jacketing.

The capacitor produced by the present invention, which is produced under the same conditions stable for a long period of time, is stable in capacitance. Therefore, in producing capacitors having a specific range of capacitance, the production yield can be enhanced.

A group of capacitors produced according to the present invention can be used in digital equipment such as personal computers, servers, cameras, game machines, DVD devices, Audio-video devices and cellular phones and electronic equipment such as various power sources.

EXAMPLES

The present invention is described in detail below by referring to Examples and Comparative Examples, however, the present invention is not limited to these Examples.
Protective Metal Plate 1:
  FIG. 3 (A) shows a side view and (B) shows a front view. It is made of iron alloy (SUS316), the inside dimension is 13 mm×8 mm×1.6 mm, the thickness is 0.2 mm, and the gap between the two hook-like parts seen in FIG. 3(A) is 0.4 mm.
Protective Metal Plate 2:
  FIG. 4 (A) shows a side view and (B) shows a front view. It is made of iron alloy (SUS316), the inside dimension is 23 mm×5 mm×1.6 mm (maximum width), the thickness is 0.2 mm, and the gap between the two hook-like parts seen in FIG. 4(A) is 15 mm. Part of the surface curves to work like a spring.
Jig for producing capacitor elements:
  As shown in FIG. 8 and FIG. 9, on the rear surface of a 1.61 mm-thick, 194 mm-long and 23 mm-wide glass-epoxy resin substrate whose lower parts in both side ends have been cut 8 mm long and 10 mm wide(the glass-epoxy substrate had been prepared by forming a wiring circuit on a copper-coated glass-epoxy substrate through etching, so that the following member parts may be mounted on the substrate), a gang socket with 64 round pins at a pitch of 2.54 mm was mounted with its socket openings being parallel to the substrate surface facing downward. Each socket was wired to a cathode of one diode, and the anode of each diode (64 in total) was wired to an electrode terminal for forming a dielectric layer which terminal is provided on the right end of the substrate. Further, each of the sockets was connected to the cathode of each constant current diode, and the anode of each constant current diode (64 in total) was wired through the circuit to an electrode terminal for forming a semiconductor layer which terminal was provided on the left end. The two electrode terminals provided on the substrate were provided respectively on 8 mm×13 mm of each end of the front surface and the rear surface of the substrate.

Capacitor-element-producing jig A, with protective metal plates 1 being attached thereto:
  Each side end of a jig was inserted into a gap of a metal plate shown in FIG. 3 (metal material) and fixed to thereby prepare a capacitor-element-producing jig A having a protective metal plate attached to each side end of the jig. Two electrode terminals provided on the substrate and each of the metal plates were electrically connected respectively.

Capacitor-element-producing jig B, with protective metal plate 2 being attached thereto:

Each side end of a jig was inserted into a gap of a metal plate shown in FIG. 4 (metal material) and fixed to thereby prepare a capacitor-element-producing jig B having a protective metal plate attached to a portion 9 mm from each side end of the jig. Two electrode terminals provided on the substrate and each of the metal plates were not electrically connected respectively.

[Frame]

Frames A and B, wherein a plurality of capacitor-element-producing jigs each having conductors welding-connected to its connection terminals with the conductors being aligned in the same direction and the same height can be arrayed in parallel at predetermined intervals were prepared. (Those are each a metal-made frame, which holds left and right sides of each capacitor-element-producing jig with the left and right parts holding the jig being electrically insulated from each other. The left side is electrically connected to the terminal for semiconductor formation present on the jig, and the right side is electrically connected to the power supply terminal for chemical formation.)

Frame A:

In the longitudinal direction of an SUS304-made metal frame having an inside dimension of 168×88 mm, an outer dimension of 194×96 mm and a thickness of 1 mm, 88-mm long, 4-mm wide and 14-mm tall comb-teeth-shaped metal blocks (having ten 2.1 mm-long, 4 mm-wide and 13-mm deep vertical slits at a pitch of 8 mm) were fixed to the frame, but electrically insulated from the frame. A pin for an external terminal was standing on the endmost point of each of the two metal blocks respectively. Ten sheets of the jig A for producing capacitor elements with the protective metal plates being attached thereto were inserted into the slits of the frame A so that each slit of the frame corresponded to each electrode part of each jig.

Frame B:

A frame B was prepared in the same manner as in frame A except that the length of a slit was set to be 1.7 mm. Ten sheets of the jig B for producing capacitor elements with the protective metal plates being attached thereto were inserted into the slits of the frame B so that each slit part of the frame corresponded to each electrode part of each jig.

[Fiducial Bar]

A 200 mm-long and 40 mm-high SUS304-made iron alloy plate whose each tip contacting the lower end of the capacitor-element-producing jig was 2-mm wide was used as a fiducial bar.

Fiducial Bar Member A:

Fiducial bar member A comprises two fiducial bars which were separated from each other by 182 mm. Fiducial bar A was used with a Frame A.

Fiducial Bar Member B:

Fiducial bar member B comprised two fiducial bars which were separated from each other by 174 mm. Fiducial bar member B was used with a Frame B.

Example 1

A tantalum sintered body (size: 3.3×2.6×1.0 mm, mass: 52 mg, having a 0.40-mmϕ outgoing lead wire, 3.7 mm of which wire was inside the sintered body and 10 mm of which wire was out of the sintered body) with a CV value of 110,000 µF·V/g was used as a conductor. In order to prevent splashing solution from attaching to the lead wire at the later step for forming a semiconductor layer, a polytetrafluoroethylene-made washer was attached to the lead wire. The lead wires of thus prepared conductors were inserted all in the same direction into sockets of the capacitor-element-producing jig A having protective metal plates attached thereto (3.5 mm of each lead wire was inserted into the socket). Ten of the thus-prepared capacitor-element-producing jigs were prepared (640 conductors in total were connected to the jigs). The jigs were each inserted into the slits of a frame A to be disposed in the frame. First, this frame A was lowered toward a chemical formation tank (containing 1% aqueous solution of anthraquinonesulfonate) placed between two bars of a fiducial bar member A. This time, the protective metal plates on a capacitor-element-producing jig A contacted with the bars of the fiducial bar member, whereby the 640 conductors could be positioned precisely and immersed in the solution.

By conducting chemical formation at a voltage of 9 V applied to the conductors, at 65° C. for 7 hours with an external terminal of the frame A electrically connected to the electrodes for forming a dielectric layer of the capacitor-element-producing jigs A serving as an anode and a tantalum plate provided in the chemical formation tank serving as a cathode, a dielectric layer comprising $Ta_2O_5$ was formed on the conductors and part of each lead wire. After the frame A was then pulled up from the chemical formation tank and washed with water, it was dried at 120° C. Subsequently, operations of immersing the frame A in a tank containing an aqueous 20% sodium molybdenum solution and of immersing it in another tank containing an aqueous 10% sodium borohydride solution (the tanks were placed between bars of fiducial bar members A respectively) were repeated alternately multiple times, whereby electrically defective minute portions were provided in the dielectric layer. Thereafter, the frame A was set above a tank containing a semiconductor layer-forming solution (a mixed solution of 20% ethylene glycol and water, to which 1% anthraquinonesulfonate and 3,4-ethylenedioxythiophene were added in an amount large enough to allow the presence of an insoluble portion) (the tank was placed between bars of another fiducial bar member A). By using as anode an external terminal of the frame A electrically connected to the electrode for forming a semiconductor layer of the capacitor-element-producing jigs A and using as a cathode a tantalum plate coating the tank wall, electric current was passed at 76 mA for 1 hour. On this occasion, the protective metal plates on the capacitor-element-producing jigs A contacted with the fiducial bars, whereby the 640 conductors could be positioned precisely and immersed in the solution. The conductors were soaked up to the top face so that a semiconductor layer was not attached to the lead wires beyond the washers. After the frame A was pulled up and washed with water and then with alcohol, it was dried at 80° C. Further, the frame was set above the above-described chemical formation tank and chemical reformation was performed at 65° C. with a voltage of 7 V applied to the conductors for 15 minutes by using the external terminal for the dielectric layer. On this occasion, the protective metal plates on the capacitor-element-producing jigs A contacted with the fiducial bars, whereby the 640 conductors could be positioned precisely and immersed in the solution. The conductors were soaked up to the middle of each lead wire so that the lead wires and the conductors could be subjected to the chemical reformation. After the frame A was pulled up, washed with water and then washed with alcohol for 5 minutes, it was dried at 90° C. After repeating 6 times these procedures of semiconductor layer formation and chemical reformation, a semiconductor layer comprising an electrically conducting polymer doped with 3,4-ethylenedioxythiophene polymer was formed. Next, the frame A was sequentially introduced to a carbon paste tank and then to a silver paste tank (each tank was placed between bars of fiducial bar members A respectively), each followed by curing and drying. (The carbon paste contained 28% by mass of graphite powder having an average particle diameter of 5.5 µm, dispersed in water, with a viscosity of 200 to 500 cps and the silver paste contained 93% by mass of flat silver powder having an average particle diameter of 5.6 µm and 7% by mass of acrylic resin in a solvent of amyl acetate with a viscosity of 1000 cps or less. Curing temperatures were 120° C. and 170° C. respectively.) Thus, an electrode layer was stacked on the semiconductor layer. On this occasion, the protective metal plates on the capacitor-element-producing jigs A contacted with the fiducial bars, whereby the 640 conductors could be positioned precisely and immersed in the pastes. The conductors were soaked in the paste up to such a level that the paste could not attach onto the topmost surface of the conductors (on which the lead wire was implanted).

The conductors on each of which an electrode layer had been formed were removed from the capacitor-element-producing jigs A. The lead wires of the conductors were each cut off 8.2 mm and then placed on the anode side of lead terminals of a separately-prepared 100-µm-thick copper-alloy-made lead frame plated with 7-µm thick matte tin plating applied on 0.7-µm-thick base nickel plating (which lead frame had 38 pairs of lead terminals at a 5.4 mm-pitch and had a tie bar for every two pairs of the lead terminals. The gap between paired lead terminals was 0.8 mm.). On the cathode side, the silver paste side of each of the conductors was placed. The former (anode side) was connected by spot welding and the latter (cathode side) was connected by using silver paste. Then, the whole excluding a part of the lead frame was encapsulated with epoxy resin (the die temperature: 165° C.) by using a transfer machine. Then, after cutting the tie bars of the frame and the cathode parts each at a predetermined portion to thereby form a comb-shaped body with the anode parts being connected, it was subjected to aging treatment at 135° C. by applying a voltage of 3 V for 2 hours, and the resin was cured at 150° C. for 10 hours. Subsequently, after cutting the lead frame at a predetermined position on the anode side, the remaining part was subjected to bending process such that the bended portions could serve as external anode/cathode terminals each of which reaches 1.3-mm-long and 0.13-mm deep step portion present in a pair on the undersurface of the encapsulated body, whereby a chip capacitor having a size of 6.0×3.2×1.8 mm was produced (the external anode/cathode terminals were out of the encapsulated body in the longitudinal direction, facing each other)(rated voltage of 2.5 V). This production process of the capacitor was repeated 100 times. In the first production, the capacitance distribution of the capacitors obtained after encapsulation was as follows: the number of capacitors having capacitance in a range from 470 to 490 µF was 612; 4 with 490 to 510 µF; 21 with 450 to 470 µF; and 3 with 430 to 450 µF (see Table 1). The capacitance distribution of the capacitor obtained in the 100th production was as follows; the number of capacitors having capacitance in a range from 470 to 490 µF was 618; 2 with 490 to 510 µF; 16 with 450 to 470 µF; and 4 with 430 to 450 µF (see Table 1).

Comparative Example 1

Chip capacitors were produced in the same manner as in Example 1 except that the capacitor element-producing jigs A were used without protective metal plates (rated voltage of 2.5 V). In the first production, the capacitance distribution of the capacitors obtained after encapsulation was as follows: the number of capacitors having capacitance in a range from 470 to 490 µF was 613; 5 with 490 to 510 µF; 20 with 450 to 470 µF; and 2 with 430 to 450 µF (see Table 1). The capacitance distribution of the capacitor obtained in the 100th production was as follows; the number of capacitors having capacitance in a range from 470 to 490 µF was 586; 2 with 490 to 510 µF; 33 with 450 to 470 µF; 7 with 430 to 450 µF; 4 with 410 to 430 µF; and 8 with less than 410° F. (see Table 1). The group of capacitors produced here had a wide variety in capacitance as compared with the capacitors produced in Example 1.

TABLE 1

| capacitance | Example 1 | | Comparative Example 1 | |
|---|---|---|---|---|
| (µF) | 1st | 100th | 1st | 100th |
| Less than 410 | 0 | 0 | 0 | 8 |
| 410-430 | 0 | 0 | 0 | 4 |
| 430-450 | 3 | 4 | 2 | 7 |
| 450-470 | 21 | 16 | 20 | 33 |
| 470-490 | 612 | 618 | 613 | 586 |
| 490-510 | 4 | 2 | 5 | 2 |

Example 2

The niobium powder having average particle diameter of 120 µm was obtained by granulating a primary niobium powder (having average particle diameter of 0.35 µm) by making use of hydrogen brittleness of niobium ingot (since the obtained powder consisted of fine particles and was naturally oxidized, 90,000 ppm of oxygen was present therein). Next, the obtained niobium powder was left standing in nitrogen atmosphere at 450° C. and then in argon atmosphere at 700° C. to thereby allow the powder partly nitrided to contain 8,000 ppm of nitrogen (with CV of 244000 µF·V/g). By molding the niobium powder with 0.48-mm ⌀ lead wires and then sintering at 1280° C., 640 sintered bodies (conductors) of 4.0×3.5× 1.7 mm (mass: 83 mg A niobium lead wire serves as a lead, 3.7 mm of the wire was present inside the sintered body and 10 mm of the wire was present outside the sintered body.)

A polytetrafluoroethylene-made washer was attached onto each lead wire in order to protect the wire from solution splashing and attaching to the wire during the following step of forming a semiconductor layer. The thus prepared lead wires were inserted in the same direction into sockets on a capacitor-element-producing jig B with the above-described protective metal plates attached thereto (3.5 mm of each lead wire was inserted in each socket). Thus, ten of such capacitor-element-producing jigs B in total were prepared (total 640 conductors were connected to the jigs) and the jigs were inserted into the slits of a frame B to stand there. First, this frame B was lowered toward a chemical formation tank (containing 1% aqueous solution of naphthalenesulfonate) placed between two bars of a fiducial bar member B. On this occasion, the protective metal plates 2 on the capacitor-element-producing jigs B contacted with the bars of the fiducial bar member B, whereby the 640 conductors could be positioned precisely and immersed in the solution.

By conducting chemical formation at a voltage of 20 V applied to the conductors at 80° C. for 7 hours with an external terminal of the frame B electrically connected to the electrodes for forming a dielectric layer of the capacitor-element-producing jigs B serving as an anode and a tantalum plate provided in the chemical formation tank serving as a cathode, a dielectric layer mainly comprising $Nb_2O_5$ was formed on the conductors and part of each lead wire. After the frame B was then pulled up from the chemical formation tank and washed with water, it was dried at 120° C.

Subsequently, operation of immersing the frame B in a tank containing an aqueous 20% by mass iron toluene sulfonate solution (the tank was placed between bars of another fiducial bar member B), followed by drying in the air, was repeated 5 times. Further, the frame B was set above a tank containing a 3% by mass aqueous toluenesulfonic acid solution (the tank was placed between bars of another fiducial bar member B) and chemical reformation was conducted at 30° C. and 15 V for 15 minutes. Then, the frame B was pulled up and then dried in the air for 60 minutes. The conductors were soaked in the solution up to a level that the liquid level of the solution did not go beyond the washers.

The frame B was set above a tank containing a solution for forming a semiconductor layer (a mixed solution of 30% ethylene glycol and water, to which 1% naphthalenesulfonic acid and pyrrole were added in an amount large enough to allow the presence of an insoluble portion) (the tank was placed between bars of another fiducial bar member B). By using as anode an external terminal of the frame B electrically connected to the electrode for forming a semiconductor layer of the capacitor-element-producing jigs B and using as a cathode a tantalum plate coating the tank wall, electric current was passed at 50 mA for 40 minutes. On this occasion, the protective metal plates 2 on the capacitor-element-producing jigs B contacted with the fiducial bars, whereby the 640 conductors could be positioned precisely and immersed in the solution. The conductors were soaked up to the top surface of the conductors so that a semiconductor layer was not attached to the lead wires beyond the washers. After the frame B was pulled up and washed with water and then with alcohol, it was dried at 80° C.

Further, the frame B was set above a separately-prepared tank containing an aqueous 7% by mass ammonium benzoate solution (the tank was placed between bars of another fiducial bar member B) and by using an external terminal for dielectric layer, chemical reformation was conducted at 80° C. and a voltage of 14 V applied to the conductors for 15 minutes. On this occasion, the protective metal plates 2 on the capacitor-element-producing jigs B contacted with the fiducial bars, whereby the 640 conductors could be positioned precisely and immersed in the solution. The conductors were soaked up to the middle of the lead wires so that the lead wires and the conductors were chemically reformed. After the frame B was pulled up and washed with water and then with alcohol for 5 minutes, it was dried at 80° C. These procedures of semiconductor layer formation and chemical reformation were repeated 8 times to thereby prepare a semiconductor layer comprising electroconductive polymer where pyrrole polymer was doped with naphthalenesulfonate ions.

Next, the frame B was sequentially introduced to a carbon paste tank and then to a silver paste tank (each tank was placed between bars of fiducial bar members B respectively), each followed by curing and drying. (The carbon paste contained 17% by mass of graphite powder having an average particle diameter of 18 μm dispersed in water, with a viscosity of 200 to 500 cps and the silver paste contained 87% by mass of flat silver powder having an average particle diameter of 7 μm and 13% by mass of acrylic resin in a solvent of amyl acetate with a viscosity of 1000 cps or less. Curing temperatures were 120° C. and 170° C. respectively.) Thus, an electrode layer was stacked on the semiconductor layer. On this occasion, the protective metal plates 2 on the capacitor-element-producing jigs B contacted with the fiducial bars, whereby the 640 conductors could be positioned precisely and immersed in the pastes. The conductors were soaked in the paste up to a position slightly below the topmost surface of the conductors so that the carbon and silver pastes could not attach onto the topmost surface of the conductors (on which the lead wire was implanted).

The conductors on each of which an electrode layer had been formed were removed from the capacitor-element-producing jigs B. The lead wires of the conductors were each cut off 8 mm and then placed on the anode side of lead terminals of a separately-prepared 100-μm-thick copper-alloy-made lead frame plated with 7-μm thick tin plating applied on 0.7-μm-thick base nickel plating (which lead frame had 32 pairs of lead terminals at a 6.5 mm-pitch and had a tie bar for every two pairs of the lead terminals. The gap between paired lead terminals was 1 mm). On the cathode side, the silver paste side of each of the conductors was placed. The former (anode side) was connected by spot welding and the latter (cathode side) was connected by using silver paste. Then, the whole excluding a part of the lead frame was encapsulated with epoxy resin (the die temperature: 165° C.) by using a transfer machine. Then, after cutting the tie bars of the frame and the cathode parts each at a predetermined portion to thereby form a comb-shaped body with the anode parts being connected, it was subjected to aging treatment at 125° C. by applying a voltage of 7 V for 3 hours, and the resin was cured at 150° C. for 10 hours. Subsequently, after cutting the lead frame at a predetermined position on the anode side, the remaining part was subjected to bending process such that the bended portions could serve as external anode/cathode terminals each of which reaches 1.5 mm-long and 0.13 mm-deep step portion present in a pair on the undersurface of the encapsulated body, whereby a chip capacitor having a size of 7.3×4.3×1.8 mm was produced (the external anode/cathode terminals were out of the encapsulated body in the longitudinal direction, facing each other)(rated voltage of 2.5 V). This production process of the capacitor was repeated 100 times. In the first production, the capacitance distribution of the capacitors obtained after encapsulation was as follows: the number of capacitors having capacitance in a range from 680 to 700 μF was 612; 16 with 700 to 720 μF; 10 with 650 to 680 μF; and 2 with 630 to 650 μF(see Table 2). The capacitance distribution of the capacitor obtained in the 100th production was as follows; the number of capacitors having capacitance in a range from 680 to 700 μF was 609; 10 with 700 to 720 μF; 18 with 650 to 680 μF; and 3 with 630 to 650 μF(see Table 2).

Comparative Example 2

Chip capacitors were produced in the same manner as in Example 2 except that the capacitor element-producing jig B was used without protective metal plates 2 (rated voltage of 2.5 V). In the first production, the capacitance distribution of the capacitors obtained after encapsulation was as follows: the number of capacitors having capacitance in a range from 680 to 700 μF was 615; 18 with 700 to 720 μF; 6 with 650 to 680 μF; and 1 with 630 to 650 μF (see Table 2). The capacitance distribution of the capacitor obtained in the 100th production was as follows; the number of capacitors having capacitance in a range from 680 to 700 μF was 590; 6 with 700 to 720 μF; 22 with 650 to 680 μF; 8 with 630 to 650 μF; 2 with 610 to 630 μF; and 12 with capacitance of less than 610 μF (see Table 2). The group of capacitors produced here had a wide variety in capacitance as compared with the capacitors produced in Example 2.

TABLE 2

| capacitance | Example 2 | | Comparative Example 2 | |
| --- | --- | --- | --- | --- |
| (μF) | 1st | 100th | 1st | 100th |
| Less than 610 | 0 | 0 | 0 | 12 |
| 610-630 | 0 | 0 | 0 | 2 |
| 630-650 | 2 | 3 | 1 | 8 |
| 650-680 | 10 | 18 | 6 | 22 |
| 680-700 | 612 | 609 | 615 | 590 |
| 700-720 | 16 | 10 | 18 | 6 |

EXPLANATION OF REFERENCE NUMBERS

Figure 1:
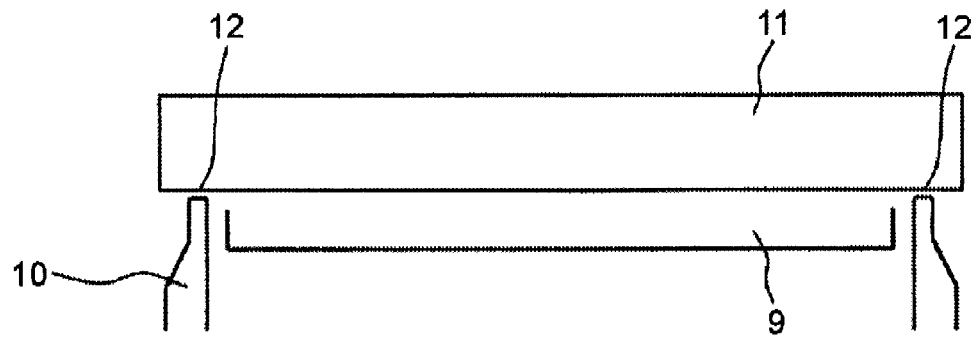
FIG. 1 is an explanatory drawing showing how the jig for producing capacitor elements is used.
Figure 2:
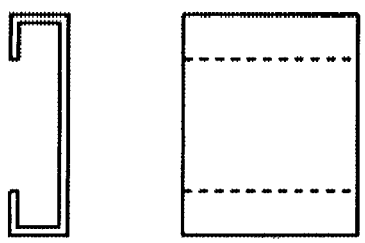
FIG. 2 shows one embodiment of a protective metal plate used with the jig of the present invention (A: front view, B: side view).
Figure 3:
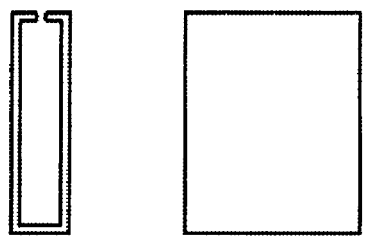
FIG. 3 shows another embodiment of a protective metal plate used with the jig of the present invention (A: front view, B: side view).
Figure 4:
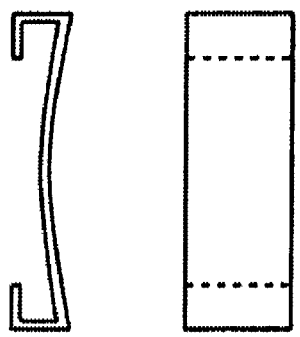
FIG. 4 shows another embodiment of a protective metal plate used with the jig of the present invention (A: front view, B: side view).
Figure 5:
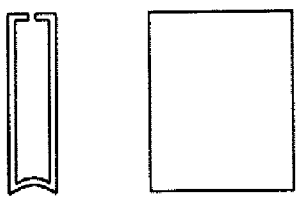
FIG. 5 shows another embodiment of a protective metal plate used with the jig of the present invention (A: front view, B: side view).
Figure 6:
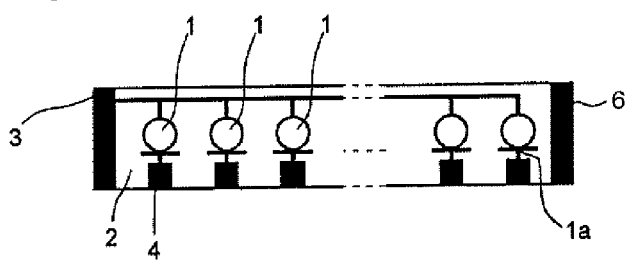
FIG. 6 shows a typical view of one embodiment of structure of the jig for producing capacitor elements of the present invention.
Figure 7:
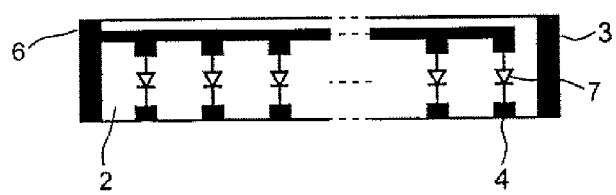
FIG. 7 shows a typical view of the rear surface in the above structure of the jig for producing capacitor elements of the present invention.
Figure 8:
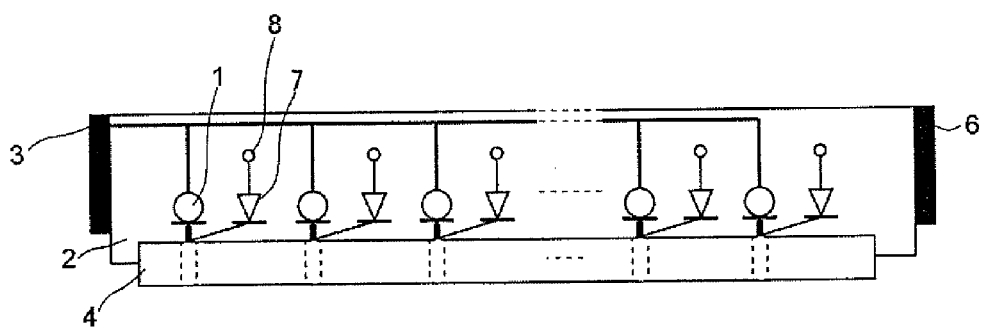
FIG. 8 shows a typical view of another embodiment of structure of the jig for producing capacitor elements of the present invention.
Figure 9:
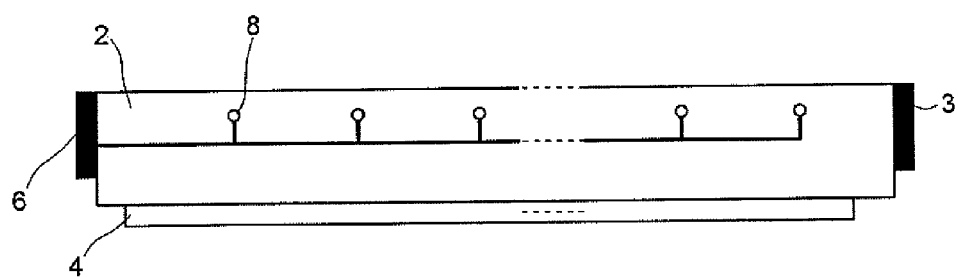
FIG. 9 shows a typical view of the rear surface in the above another embodiment of structure of the jig for producing capacitor elements of the present invention.

1 constant current diode
1*a* cathode
2 insultaive substrate
3 collector terminal
4 connection terminal for conductor
6 supply terminal for chemical formation
7 rectifier diode
8 through-hole
9 solution tank
10 fiducial bar
11 jig for producing capacitor elements
12 position at which the jig is supported

The invention claimed is:

1. A jig for producing capacitor elements, the jig being made of a resin material, which jig simultaneously accommodates a plurality of capacitor element substrates and processes the substrates, wherein the jig contains parts that support the jig during the processing, and these parts are protected with a metal material, wherein the jig has a long-plate form and the parts for supporting the jig are on both ends in the longitudinal direction or in the vicinity of the ends, and wherein the metal material is in the form of a cylinder which covers a part of the jig including the supporting portions of the resin material, which cylinder may have a cleavage groove in part.

2. The jig for producing capacitor elements according to claim 1, wherein the protecting metal material is fixed to the resin material by making use of its resilience.

3. The jig for producing capacitor elements according to claim 1, which has at least part of an electric circuit for applying electric current to each capacitor element substrate.

4. A method for producing capacitor element, using the jig for producing capacitor elements described in claim 1.

5. The jig for producing capacitor elements according to claim 1, wherein the resin material is glass-epoxy resin.

6. The method for producing capacitor element according to claim 4, wherein in a solution for forming a semiconductor layer, a semiconductor layer is formed on substrates for capacitor elements each having a dielectric layer thereon connected with the jig for producing capacitor elements by applying electric current with the capacitor element substrates being used as anode and an electrode provided in the solution for forming a semiconductor layer being used as cathode.

* * * * *